United States Patent [19]

Rippel

[11] Patent Number: 4,873,460
[45] Date of Patent: Oct. 10, 1989

[54] MONOLITHIC TRANSISTOR GATE ENERGY RECOVERY SYSTEM

[75] Inventor: Wally E. Rippel, Altadena, Calif.

[73] Assignee: California Institute of Technology, Pasadena, Calif.

[21] Appl. No.: 271,644

[22] Filed: Nov. 16, 1988

[51] Int. Cl.[4] .................. H03K 17/04; H03K 17/687
[52] U.S. Cl. .................................. 307/571; 307/268; 307/584
[58] Field of Search ............... 307/571, 582, 583, 584, 307/246, 266, 268, 261

[56] References Cited

U.S. PATENT DOCUMENTS

| | | | |
|---|---|---|---|
| 4,461,966 | 7/1984 | Hebenstreit | 307/571 |
| 4,694,206 | 9/1987 | Weingerb | 307/571 |
| 4,767,952 | 8/1988 | Nollet | 307/571 |

FOREIGN PATENT DOCUMENTS

| | | | |
|---|---|---|---|
| 0242416 | 10/1986 | Japan | 307/571 |
| 0239718 | 10/1987 | Japan | 307/571 |
| 0139421 | 6/1988 | Japan | 307/571 |

Primary Examiner—John Zazworsky
Attorney, Agent, or Firm—Freilich. Hornbaker, Rosen & Fernandez

[57] ABSTRACT

Energy is recovered from an insulated gate semiconductor switch, such as a MOSFET, that is otherwise lost in the gate capacitance by producing a notch in the gate control voltage for an interval B following an interval A after initial application of a gate control voltage pulse for turning the switch on, and a notch for an interval C following termination of the gate control voltage pulse followed by interval D during which the switch is turned on again, where each interval is a period $\Delta T$ given by $$\Delta T = \frac{\pi}{3} \sqrt{L_s C_{in}}.$$

$L_s$ is the inductance (discrete and/or parasitic) in series with the gate electrode of the insulated gate semiconductor switch, and $C_{in}$ is the capacitance of that switch between its gate and source electrodes. The interval $\Delta T$ may be provided directly by timing in a pulse forming circuit for the gate control voltage applied, or adaptively by sensing the gate voltage $v_g$ and comparing it with fixed progressively higher voltages $v_1$, $v_2$ and $v_3$, where $v_2$ is intermediate $v_1$ and $v_3$ which correspond to the lower and upper levels of $v_g$ as the switch is turned off and on.

3 Claims, 3 Drawing Sheets 4,873,460

MONOLITHIC TRANSISTOR GATE ENERGY RECOVERY SYSTEM

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

This invention relates to a system for recovering energy lost in the gate capacitance of an insulated gate power semiconductor switch, e.g., MOS gate field-effect transistors, or MOSFETs, during high frequency switching, and to extend operation to higher frequencies.

BACKGROUND ART

It is common practice to employ FETs having insulated gates in switching converters and inverters. A problem is that at low power significant energy is lost in the gate capacitance of the FETs. This loss is due to the fact that the insulated gate must be continually charged and discharged as the FET is turned on and off.

The energy stored in the gate capacitance is $\frac{1}{2}CV^2$, and V is the gate drive source voltage. With conventional gate drive circuitry, the energy transfer efficiency is limited to 50%. Furthermore, with conventional circuitry, none of the gate energy is captured upon turn-off. Accordingly, the energy consumed from the gate drive source is at least $CV^2$ per switching cycle, and the corresponding power consumption is at least $CV^2f$, where f is the switching frequency.

However, if gate charging efficiency can be improved beyond the conventional 50%, and/or if a portion of the gate energy can be recovered upon turn-off, then gate drive power losses can be reduced. Besides improving overall energy conversion efficiency, such an improvement will also enable increased frequency operation in those cases where gate losses are a significant portion of the switching losses.

STATEMENT OF THE INVENTION

In accordance with the present invention, the gate control system is provided with a pulse forming circuit that produces a waveform having a zero-level notch near the beginning and the end of the commanded "on" period, and with series inductance that resonates the gate capacitance as the semiconductor gate is being switched on and off so its energy can be recovered during the notches of the drive waveform.

DETAILED DESCRIPTION OF THE INVENTION

Figure 1:
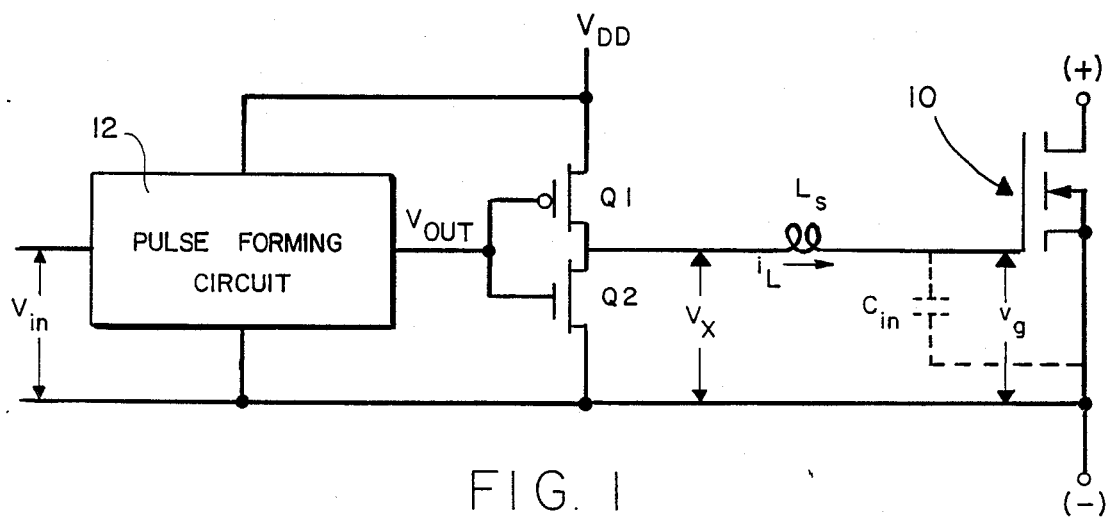
FIG. 1 is a circuit diagram of a preferred embodiment of the invention using a pulse forming circuit for generating the desired gate control waveform for a power semiconductor switch.
Figure 2:
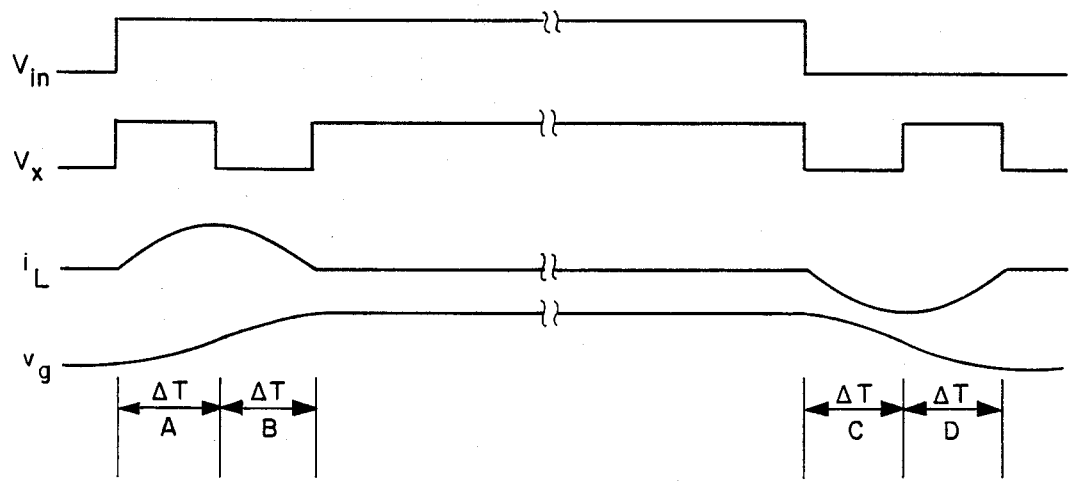
FIG. 2 illustrates voltage and current waveforms at indicated places of the circuit shown in FIG. 1.

Referring to FIG. 1, a circuit is shown for recovering the energy normally lost by charging and discharging gate capacitance of an insulated gate power semiconductor switch 10, such as metal-oxide semiconductor field-effect transistors (MOSFETs) or other insulated gate field-effect transistors (IGFETs), during high frequency switching, for example, in a low voltage power converter or inverter. For illustration, an N-channel enhancement mode MOSFET is shown for low voltage switching applications (typically 5 volts), although it could be any power semiconductor switch. A pulse forming circuit 12 produces a gate control waveform $V_{out}$ in response to an input waveform $V_{in}$ as shown in the waveform timing diagram of FIG. 2. Transistors $Q_1$ and $Q_2$ are employed to switch the gate of the transistor 10 through series inductance $L_s$, i.e., to produce the ultimate voltage waveform $V_x$ used to actually control the gate of the transistor 10. That series inductance is shown schematically as a discrete inductor but may consist of parasitic inductance, in whole or in part.

The transistors $Q_1$ and $Q_2$ are illustrated as p-channel and n-channel CMOS-type FETs to facilitate a circuit that will switch the voltage $V_x$ to $V_{DD}$ when $V_{out}$ is high and to switch the voltage $V_x$ to a source of reference potential when $V_x$ is low for the switching device 10 illustrated as simply (−) for convenience. The capacitance of the switching device 10, illustrated by a capacitor $C_{in}$ in dotted lines, is alternately charged from the source $V_{DD}$ through the inductance $L_s$ and discharged to the source of reference potential through the inductance $L_s$ as the transistors $Q_1$ and $Q_2$ are alternately switched on.

The waveform $V_x$ contains zero-volt notches of specific length and placement with respect to the input timing signal $V_{in}$ at the beginning and end of the usual drive signal, whereby the capacitance $C_{in}$ is resonantly charged and discharged to recover energy from the capacitor during the notches, as will now be described. The internal gate capacitance of the switching device 10 and the series inductance, which may be a discrete element of may be partially parasitic in nature, form a resonant circuit. The gate control waveform is high for one time interval A and low for another time interval B at the beginning the pulse $V_{in}$. The length of this interval $\Delta T$ may be determined from the equation $$\Delta T = \frac{\pi}{3} \sqrt{L_s C_{in}}$$

which is a length of 60 electrical degrees of the resonant period.

During the time interval A, energy is transferred from the supply (not shown), at a voltage $V_{DD}$ to both the inductance $L_s$ and the capacitance $C_{in}$ via transistor $Q_1$ which has been turned on by the pulse forming circuit 12. The inductance conducts current in a sinusoidal manner (for 60°), shown in FIG. 2 by the waveform $i_L$. During interval B, semiconductor switch $Q_1$ is turned off and inductance current $i_L$ decays, also in a sinusoidal manner identical to a sinewave from 120° to 180°, and all the energy formerly stored in the inductance $L_s$ is transferred to the capacitance $C_{in}$. This charges the gate up to supply voltage $V_{DD}$, and this fully turns on the semiconductor switch 10 as shown by the waveform $v_g$ in FIG. 2. At the time of desired shutoff at interval C, the process is reversed, and the capacitance $C_{in}$ begins discharging through transistor $Q_2$; the current $i_L$ now flows in the opposite direction. By the end of interval D, the capacitor is discharged completely and the inductance has ceased conducting. Thus, the power semiconductor switch 10 is turned off.

The power semiconductor switch transistor 10 is turned on fully for a total time less than the duration of the pulse $V_{in}$ by the length of the four intervals, A through D. At very high frequencies, this difference might begin to be significant; in which case the logic circuit can be designed to add the required length to the gate control waveform $V_x$. However, in many cases this will not be significant; the rise and fall times being shorter than those met within existing practice. Because of the energy recovery, this innovation has a higher efficiency and can operate at higher rates than conventional switching circuits for a power semiconductor switch having an insulated gate FET.

Figure 3:
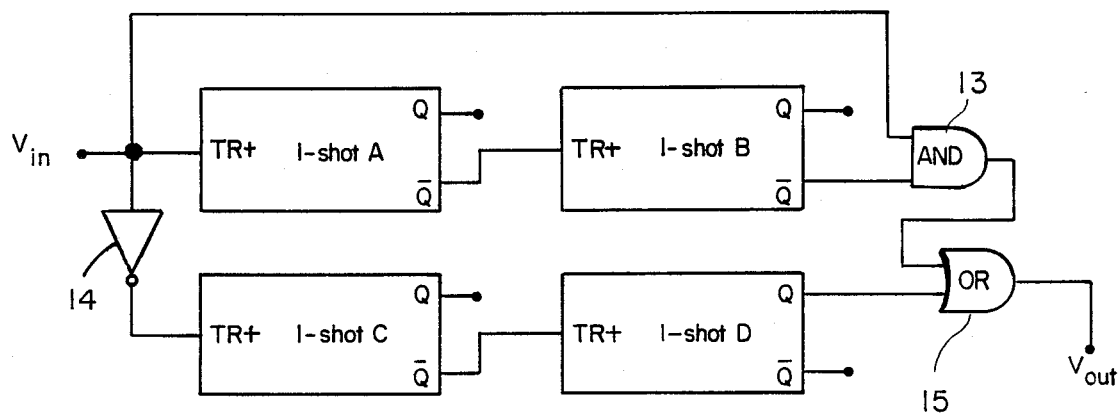
FIG. 3 illustrates a first embodiment of the pulse forming circuit of FIG. 1 using timing elements for generating the desired gate control waveform.
Figure 4:
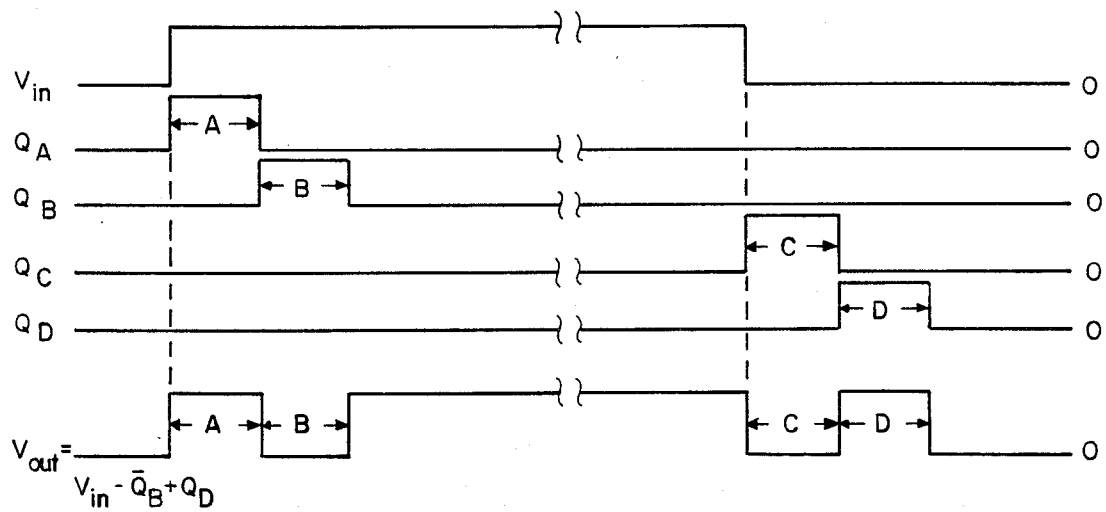
FIG. 4 is a timing diagram for operation of the pulse forming circuit of FIG. 3.

An example of a circuit for forming the waveform $V_{out}$, which in turn produces the waveform $V_x$, will now be described with reference to FIG. 3 for the application where the interval $\Delta T$ is predetermined. Four monostable multivibrators labeled OS (one-shot) A, B, C and D are employed to time the intervals A, B, C and D in FIG. 2. The positive going edge of the input pulse $V_{in}$ triggers the OS A to produce a positive pulse $Q_A$ of interval A at its output terminal A as shown in FIG. 4. That pulse is effectively inverted by connecting the output $\overline{Q}$ of the OS A to the input of OS B. That triggers the OS B to produce at its output Q a pulse of interval B. The output $\overline{Q}$ of the OS B and the input $V_{in}$ are applied to an AND gate 13 to produce the first part of the waveform $V_{out}$ as shown in FIG. 4.

At the trailing edge of the signal $V_{in}$, the procedure is repeated for producing the intervals C and D in the output waveforms using OS C and OS D, but since the one-shots are triggered by a positive going edge of a pulse signal, an inverter 14 is employed to couple the signal $V_{in}$ to the trigger input of the OS C. As is clearly evident from the waveforms $Q_C$ and $Q_D$, what is required for the waveform $V_{out}$ is a positive pulse for the interval D. This is readily achieved by combining the output of the AND gate 13 with the output Q of the OS D through an OR gate 15 such that $V_{out}$ is given by the logic equation:

$$V_{out} = V_{in} \cdot \overline{Q}_B + Q_D.$$

The intervals A, B, C and D are established a priori by the RC timing of the one-shots. In this embodiment, the intervals A, B, C and D are independent of the actual gate circuit parameters; having been predetermined and set by the RC time constants of the one-shots, the intervals thus set for optimum energy recovery may not be precisely optimum if the parameters should change due to temperature, aging, etc. To provide optimum interval timing, the pulse forming circuit would have to be made adaptive to a changing situation, as will now be described with reference to FIGS. 5 and 6.

Figure 5:
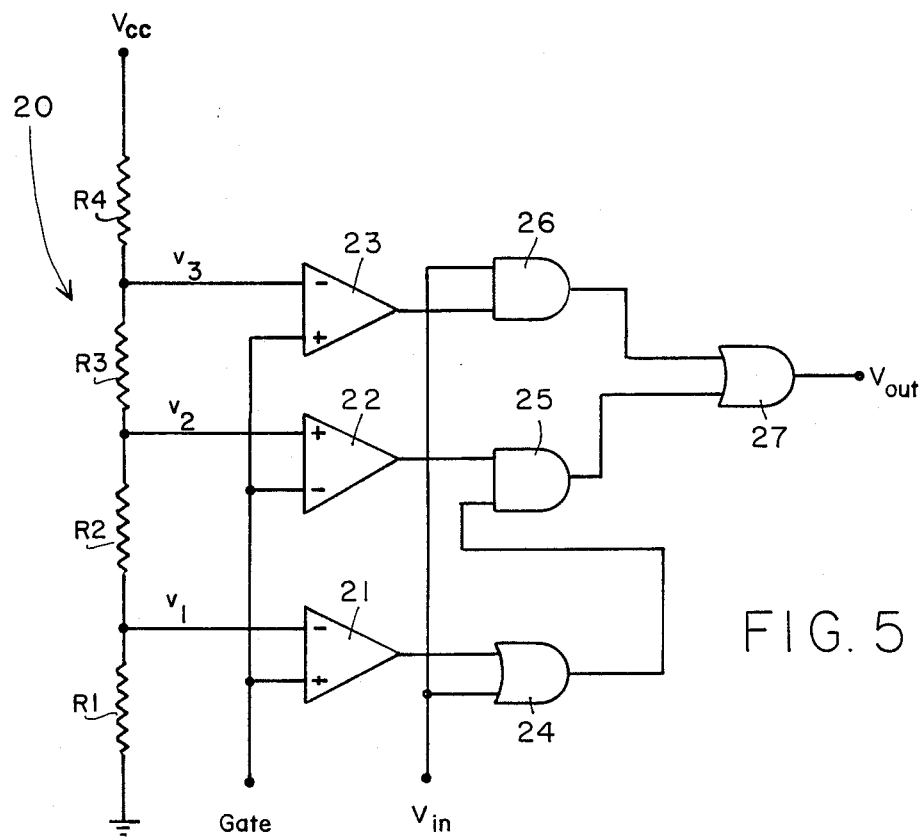
FIG. 5 illustrates a second embodiment of the pulse forming circuit of FIG. 1 using comparators to determine the timing of the desired waveform.

Referring to FIG. 5, an adaptive pulse forming circuit is comprised of a voltage dividing network 20 in which the resistors $R_1$ through $R_4$ are selected to produce progressively higher threshold voltages $v_1$, $v_2$ and $v_3$ with which the gate voltage $v_g$, shown in FIG. 1, is to be compared by comparators 21, 22, and 23. The outputs of these comparators are then combined by an OR gate 24, and gates 25 and 26, and a second OR gate 27 to produce from the sensed gate voltage $v_g$ the precise timing for the notches in accordance with the timing waveforms of FIG. 6 where the first sensing of the threshold voltage $v_2$ via comparator 22 will produce the first notch after a $V_{in}$ pulse by driving $V_{out}$ down. At that moment, comparator 21 determines that $v_g$ is greater than the threshold voltage $v_1$ to enable the gate AND 25 via OR gate 24, but until that moment $v_2$ is greater than $v_g$ so the output of comparator 22 is also positive to produce a positive pulse in the output signal $V_{out}$ for the time interval A. Then at the moment $v_2$ is no longer greater than $v_g$, the output of the comparator 22 goes down, and the signal $V_{out}$ goes down until it is sensed that $v_g$ is greater that $v_3$, at which time the AND gate 26, enabled by $V_{in}$, produces a positive signal $V_{out}$ via the OR gate 27.

At the end of the pulse $V_{in}$, the AND gate 26 is disabled causing a notch for interval C, until it is sensed that $v_g$ is less than $v_2$ by the comparator 22, at which time the AND gate 25 is enabled to produce a positive signal $V_{out}$ via the OR gate 27. At the end of interval D, the comparator 21 senses that $v_g$ is no longer greater than $V_{in}$ (which is then zero), and ceases enabling the AND gate 25 via the OR gate 24.

Figure 6:
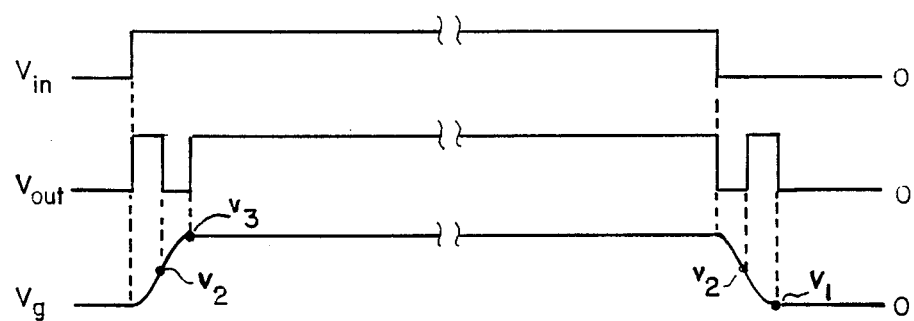
FIG. 6 illustrates waveforms in the second embodiment that will assist in understanding its operation.

FIG. 6 accurately depicts operation of the adaptive pulse forming circuit shown in FIG. 5, even to the extent that $v_g$ is caused to charge (interval A) and then discharge (interval B) and the converse at the end of the pulse $V_{in}$. By thus causing the gate voltage $v_g$ to follow the waveform shown, i.e., to charge and discharge in the intervals indicated, not only does energy recovery have a higher efficiency, but also the controlling gate voltage $v_g$ can operate the power semiconductor switch 10 at higher rates than conventional gate driving circuits. Thus, by control of the charge and discharge intervals of the gate capacitance $C_{in}$, and the use of a resonant inductance $L_s$ in series, more efficient use is made of the energy stored in the resonant LC circuit, and this in turn allows for higher frequency switching of the insulated gate power semiconductor switch 10, be it MOSFET, IGFET or any other FET having significant capacitance at its gate that must be charged and discharged.

Although particular embodiments of the invention have been described and illustrated herein, it is recognized that modifications and variations may readily occur to those skilled in the art. Consequently, it is intended that the claims be interpreted to cover such modifications and variations.

I claim:

1. A pulse forming circuit for control of the gate of an insulated gate semiconductor switch having capacitance between its source and gate electrodes, and inductance in series with its gate electrode comprising means for producing a notch in an applied input control voltage after an interval A following the initial application of the input control voltage for an interval B, and a notch for an interval C following termination of the applied input control voltage followed by a pulse of an interval D, where each interval is a period $\Delta T$ given by $$\Delta T = \frac{\pi}{3} \sqrt{L_s C_{in}}$$

where $L_s$ is said series conductance and $C_{in}$ is said capacitance, comprising means responsive to the initial application of said control input voltage for determining said intervals A and B and means responsive to the termination of said control input voltage for determining said intervals C and D, means responsive to said intervals A and B for producing a notch after initial application of said control input voltage, and means responsive to said intervals C and D for producing a notch after termination of said control input voltage, whereby said notches at the leading and trailing ends of said control input voltage to the gate of said transistor will switch said gate to an off level during said notches of said intervals B and C while switching said gate to an on level during intervals A and D and for the entire period between intervals B and C.

2. Apparatus as defined in claim 1 wherein said intervals, A, B, C and D are timed by timing circuits, each interval being equal to $$\Delta T = \frac{\pi}{3} \sqrt{L_s C_{in}}.$$

3. Apparatus as defined in claim 1 wherein said intervals A, B, C and D are determined by sensing the gate voltage $v_g$ of said transistor and switching from interval A to interval B when said gate voltage $v_g$ reaches an intermediate threshold voltage $v_2$ between off and on, terminating said interval B upon sensing said gate voltage is no longer below a higher threshold voltage $v_3$, switching to interval C upon sensing that the control input voltage has terminated, switching to interval D upon sensing that said gate voltage has dropped below said threshold voltage $v_2$, and terminating said interval D upon sensing that said gate voltage is no longer greater than a threshold voltage $v_1$, *where said threshold voltages $v_1$, $v_2$ and $v_3$ are progressively higher constant voltage levels.*

* * * * *